United States Patent [19]

Martens et al.

[11] Patent Number: 5,019,721
[45] Date of Patent: May 28, 1991

[54] ACTIVE SUPERCONDUCTING DEVICES FORMED OF THIN FILMS

[75] Inventors: Jon S. Martens; James B. Beyer; James E. Nordman; Gert K. G. Hohenwarter, all of Madison, Wis.

[73] Assignee: Wisconsin Alumni Research Foundation, Madison, Wis.

[21] Appl. No.: 395,965

[22] Filed: Aug. 18, 1989

[51] Int. Cl.$^5$ .................. H03K 3/38; H03K 17/92
[52] U.S. Cl. ............................ 307/306; 307/245; 357/5; 505/865; 505/874
[58] Field of Search .............. 307/245, 277, 306, 476; 357/5; 505/1, 832, 861, 865, 874

[56] References Cited

U.S. PATENT DOCUMENTS

| | | |
|---|---|---|
| 3,116,427 | 12/1963 | Giaever ........................... 307/245 |
| 4,157,555 | 6/1979 | Gray . |
| 4,334,158 | 6/1982 | Faris . |
| 4,458,160 | 7/1984 | Josephs et al. . |
| 4,585,999 | 4/1986 | Hilbert et al. . |
| 4,621,203 | 11/1986 | Sweeny .......................... 357/5 |
| 4,820,688 | 4/1989 | Jasper, Jr. . |

OTHER PUBLICATIONS

Gaiver "Magnetic Coupling Between Two Adjacent Type-II Superconductors", Physical Review Letters, vol. 15, No. 21, Nov. 22, 1965, pp. 825-827.
K. K. Likharev, "Vortex Motion and the Josephson Effect in Superconducting Thin Bridges", Soviet Physics JETP, vol. 34, No. 4, Apr. 1972, pp. 906-912.
S. Hontsu, et al., "Fluxon Propagation of a Parallel Array of Microbridge-Type Josephson Junctions", J. Appl. Phys., vol. 63, No. 6, Mar. 15, 1988, pp. 2021-2028.
News Release by University of Houston Entitled "Texas Center for Superconductivity Researchers Invent Superconducting Transitor", Three Pages, Publication Date Uncertain, but Apparently Distributed as of May 25, 1989.
G. K. G. Hohenwarter, et al., "Single Superconducting Thin Film Devices for Applications in High T$_c$ Material Circuits", Proceedings of the 1988 Applied Superconductivity Conference, 1989, Paper Presented at the Applied Superconductivity conference Aug. 21-25, 1988, San Francisco, Calif. This Paper was also Published in the IEEE Transactions on Magnetics, vol. 25, No. 2, Mar. 1989.
J. S. Martens, et al., "S Parameter Measurements on Single Superconducting Thin-Film Three-Terminal Devices Made of High-T$_c$ and Low-T$_c$ Materials", J. Appl. Phys. vol. 65, No. 10, May 15, 1989, pp. 4057-4060.
J. S. Martens, et al., "A Superconducting Single Film Device Oscillator Made of High T$_c$ and Low T$_c$ Materials", Proceedings of 1989 MTT-S International Microwave Symposium, Long Beach, Calif., 13-15 Jun. 1989, p. 443 et seq.

Primary Examiner—John Zazworsky
Attorney, Agent, or Firm—Foley & Lardner

[57] ABSTRACT

Active superconducting devices are formed of thin films of superconductor which include a main conduction channel which has an active weak link region. The weak link region is composed of an array of links of thin film superconductor spaced from one another by voids and selected in size and thickness such that magnetic flux can propagate across the weak link region when it is superconducting. Magnetic flux applied to the weak link region will propagate across the array of links causing localized loss of superconductivity in the links and changing the effective resistance across the links. The magnetic flux can be applied from a control line formed of a superconducting film deposited coplanar with the main conduction channel and weak link region on a substrate. The devices can be formed of any type to superconductor but are particularly well suited to the high temperature superconductors since the devices can be entirely formed from coplanar films with no overlying regions. The devices can be utilized for a variety of electrical components, including switching circuits, amplifiers, oscillators and modulators, and are well suited to microwave frequency applications.

33 Claims, 12 Drawing Sheets

ACTIVE SUPERCONDUCTING DEVICES FORMED OF THIN FILMS

FIELD OF THE INVENTION

This invention pertains generally to the field of superconductivity and particularly to active electronic devices which are formed of superconducting materials.

BACKGROUND OF THE INVENTION

Various types of superconducting active electronic devices have been proposed, typically utilizing Josephson junctions in which two layers of superconducting material are separated by a tunneling barrier. Such Josephson junction devices can be successfully formed from a variety of conventional superconducting materials (i.e., those which exhibit a superconducting transition temperature which can only be achieved with a liquid helium or liquid hydrogen coolant).

The more recently developed "high temperature" superconductors are ceramic type materials which exhibit a superconducting transition temperature significantly higher than the transition temperatures of classical superconductors. Hence, these materials may be cooled to their superconducting state by more economical coolants than liquid hydrogen or liquid helium. Such materials are not readily suited to construction of Josephson junction type devices. The relative instability of the currently available high temperature superconductors makes the fabrication of multi-layer structures difficult. The materials degrade upon contact with many substances and the annealing processes usually employed affect the superconducting characteristics of the materials.

SUMMARY OF THE INVENTION

In accordance with the present invention, thin film active devices are formed of superconductors in which both the main input-output channel and the control structure can be formed coplanar with one another with no junction between the two electrically isolated structures. An active weak link region is interposed in the main channel and comprises an array of very small links of superconductor, separated by voids, across which the current flows from the input to the output of the main channel. The thickness of the superconducting film forming the main channel and the links, and the dimensions of the links, are selected so that flux can propagate across the bridge formed by the series of links. The flux vortices which propagate across the bridge are produced by current passed through a control line which is preferably coplanar with and closely adjacent to the active region of the main channel which contains the links. The localized flux vortices produced by the current in the control line causes localized areas within the superconductor material of the link to transition to a resistive state, thereby allowing the current flow through the main channel to be controlled by the current flowing through the control line.

The device can be formed with the control line adjacent to or superimposed over the main channel. A control line which is coplanar with the main channel is preferred since such a structure minimizes the capacitive coupling between the main channel and the control line. Such capacitance can sometimes determine the upper frequency limit of the device. Devices in accordance with the invention can be fabricated both with conventional superconductors and with high temperature superconductors since the processing steps required to form the single layer devices do not excessively degrade the superconducting performance of these materials.

Devices in accordance with the present invention can be formed as digitally controlled switches, as amplifiers, as oscillators, and as phase modulators. The devices are particularly well suited to very high radio frequencies (RF) because of the low inherent capacitance of these devices.

Further objects, features and advantages of the invention will be apparent from the following detailed description when taken in conjunction with the accompanying drawings.

DETAILED DESCRIPTION OF THE INVENTION

The present device utilizes parallel arrays of weak links which utilize a magnetic control mechanism to control the superconductivity in the links and thereby the current flowing through them. The links join two sections of a main channel and are formed of a superconductor which is sufficiently thin to provide the desired flux responsive behavior. The I-V curves for these devices are hysteretic and have significant non-linearities at sufficiently high drives. The control current can either be injected into the device at or near the bridge of links or can be run through an adjacent control line to change the I-V curve. This change in the I-V curve can be attributed to a change in flux density in the device while it is biased in a flux flow region. The control signal can be modeled by a current controlled voltage source since a current in the control line causes a horizontal shift of the flux flow section of the I-V curve for small control currents. Biasing may be done with a current source which is readily realizable because of the very low device impedances.

The basic element of the device is the variable thickness bridge as discussed, for example, by Likharev, Soviet Physics - JETP, Vol. 34, 906 (1972). While the links will not have small dimensions relative to the coherence length, coherent effects can still be observed with this structure. The desired properties are a small link thickness relative to the effective penetration depth and links made of relatively "dirty" material.

Figure 1:
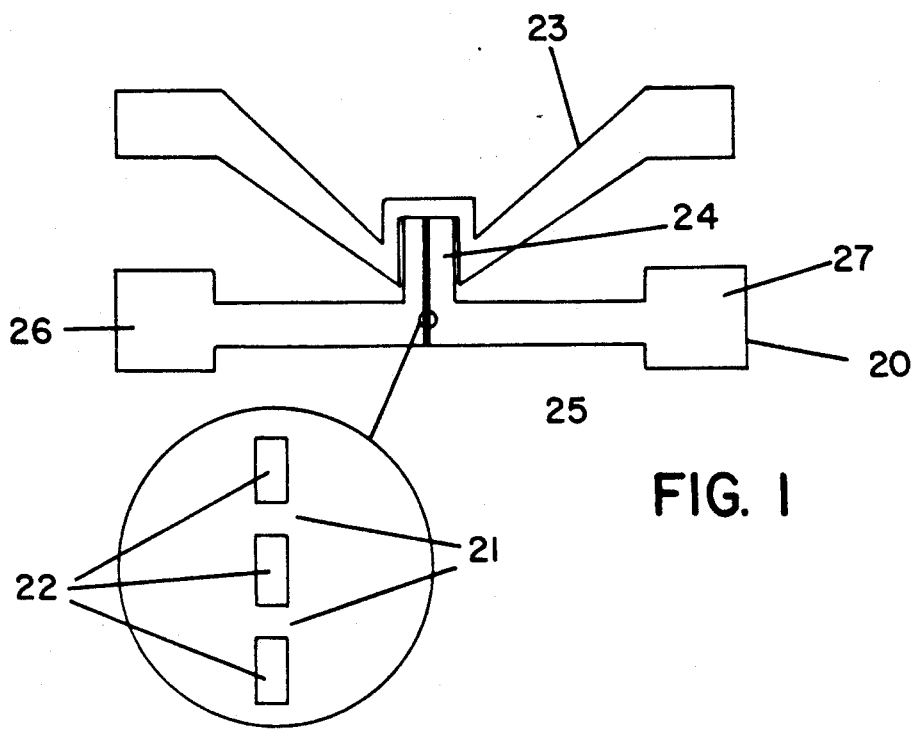
FIG. 1 is an illustrative view of a thin film device in accordance with the invention formed on a planar substrate.

An exemplary device shown generally at 20 in FIG. 1 is made from a single layer of superconductor etched into the desired pattern of 30 parallel links each about 7 micrometers ($\mu$m) long by 7 $\mu$m wide. The links are separated by and bounded by voids or holes 22 in the pattern so that no superconductor is formed in the hole region. The device includes a control line 23 (rf input) which is 20 $\mu$m wide near the active region 24. A main conduction channel 25 has pads 26 and 27 for DC biasing and for rf (radio frequency) output and is about 1 mm long. For purposes of clear illustration, FIG. 1 is not drawn to scale.

One embodiment of the device 20 was formed by depositing niobium onto a planar glass substrate with a dc magnetron sputtering source to a thickness of about 40 nm which was then patterned with anodic oxidation. The thickness of the active link region 24 was reduced relative to that of the rest of the main channel 25. This thickness reduction was also done with anodic oxidation and the final thickness of the links 21 was 5-10 nm. Another embodiment of the device 20 was produced from granular YBaCuO films prepared using sputter deposition onto planar MgO substrates to a thickness of about 400 nm. Patterning was done with a 6-mol/l solution of $HNO_3$. Link thickness was reduced in the same manner as with Nb except a weak $HNO_3$ solution was used instead of anodization. The amount of reduction was loosely controlled by timing the immersion in the acid and is repeatable to within about 5 nm. The final link thickness for these YBaCuO samples was about 20 nm. The link thickness is a critical parameter in that it strongly determines how efficiently the control line can affect the device behavior. For maximum sensitivity, the transition temperature of the material in the link region should be reduced such that it is close to the operating temperature. The $T_c$ of the YBaCuO links was reduced to about 30 K from a starting value of about 80 K, and that of the Nb links was reduced to about 6 K from about 8.7 K during the above described processing.

Figure 2:
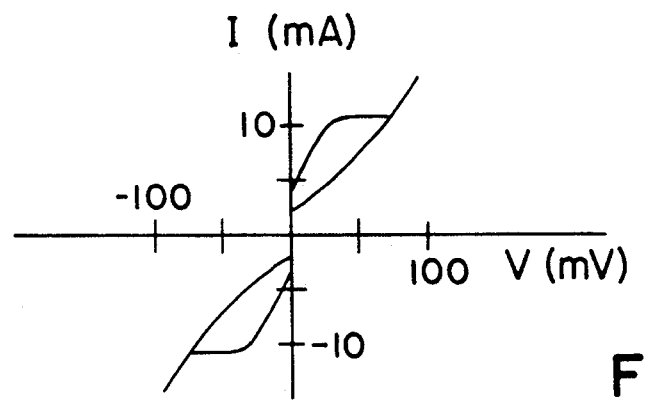
FIG. 2 is a current versus voltage (I-V) curve for a device in accordance with the invention formed of a high temperature superconductor.
Figure 3:
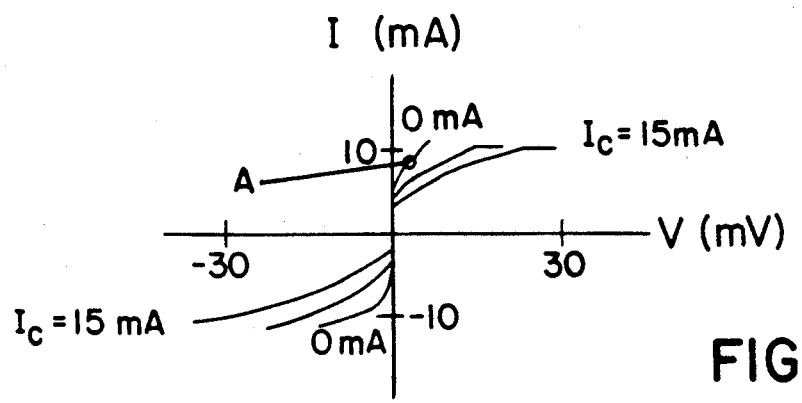
FIG. 3 is an I-V graph for the same device as in FIG. 2, expanded about the zero voltage line and showing the dependence on the control current in the control line.

The I-V curve for one of the YBaCuO devices at 4.2 K is shown in FIG. 2, and the flux flow signature is shown in FIG. 3 with the associated dependence on applied magnetic field from the current $I_c$ in the control line. The I-V curve for a Nb device at 4.2 K is similar except the voltages in the flux flow region are much smaller. The temperature dependence was not measured. At the rf power levels used, the I-V curve was independent of rf applied power. With this particular device, the response is essentially a horizontal shift of all but the zero voltage section. The transresistance of the device will be defined as the ratio of a change in device terminal voltage to a change in the applied control current. For the purposes of measuring the transresistance, we look at the ratio of the change in terminal voltage to the change in control current at the bias current which corresponds to point A in FIG. 3. This point is the midpoint of the flux flow branch line shown in FIG. 3 with no external B field, that is, zero control current. The device was biased near this point for the rf tests. Based on the measured response to the control line excitation, the transresistance is about 0.5±0.1 ohms for Nb devices and about 0.9±0.2 ohms for YBaCuO devices. This information is used below to help interpret the S parameter data.

Figure 4:
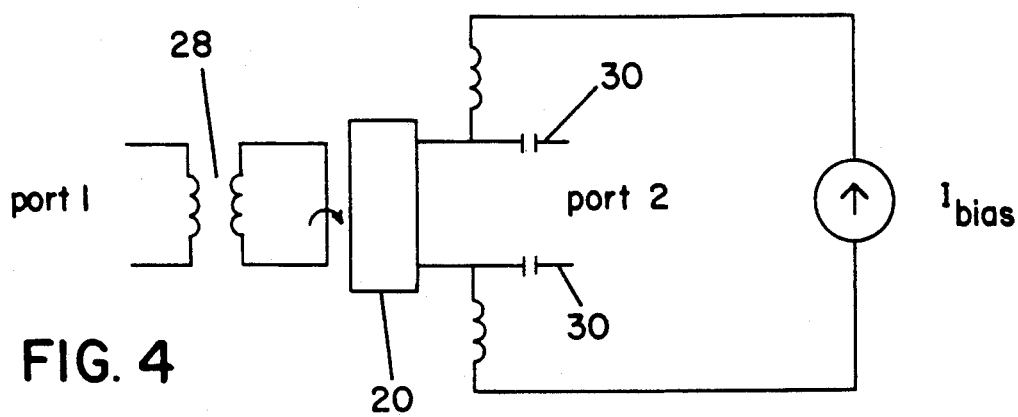
FIG. 4 is a schematic circuit diagram of a test set-up for determining the S parameter measurements for devices in accordance with the present invention.

The experimental circuit configuration for testing the foregoing devices is shown in FIG. 4. Port 1 is coupled to the device 20 through a ferrite core transformer 28 wound with NbTi wire and mounted on the substrate of the device 20. The tests were conducted at 4.2 K so the transformer was superconducting. The turns ratio is 30:1, hence the input impedance is raised by a factor of 900. The resulting impedance, a few ohms typically, will still be considerably less than the system level of 50 ohms. Transformers with higher transformation ratios were not practical because of leakage inductance and size constraints. Over the frequency range studied, the impedance levels are largely constant. The bandwidth of the transformer was measured to be about 120 MHz and was the limiting factor in the measurements. A slightly different and somewhat lossier transformer was used for testing the YBaCuO samples. This was mechanically necessary because a different fixture was required for the YBaCuO devices to alleviate contact problems. The turns ratio was 15:1 for this transformer and the measured bandwidth was about 80 MHz. These parameters are important for interpreting the S parameter data. The device was connected to an HP 8753 network analyzer and biased into the flux flow branch with the bias tees 30 shown.

Figure 5:
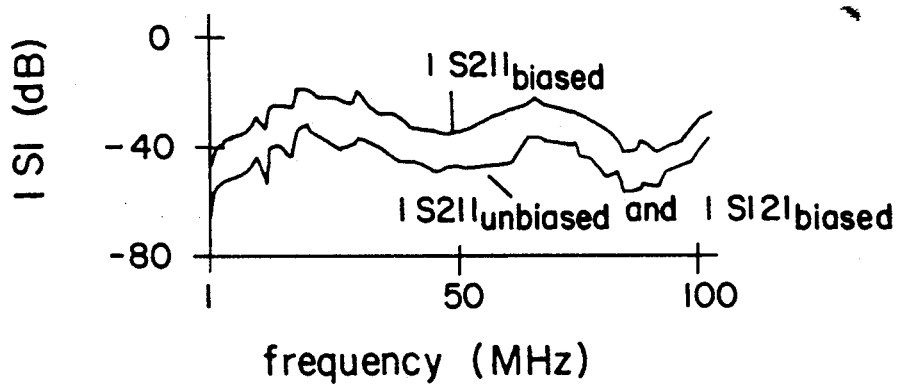
FIG. 5 is a graph showing measured S parameter data for a niobium device formed in accordance with the invention.
Figure 6:
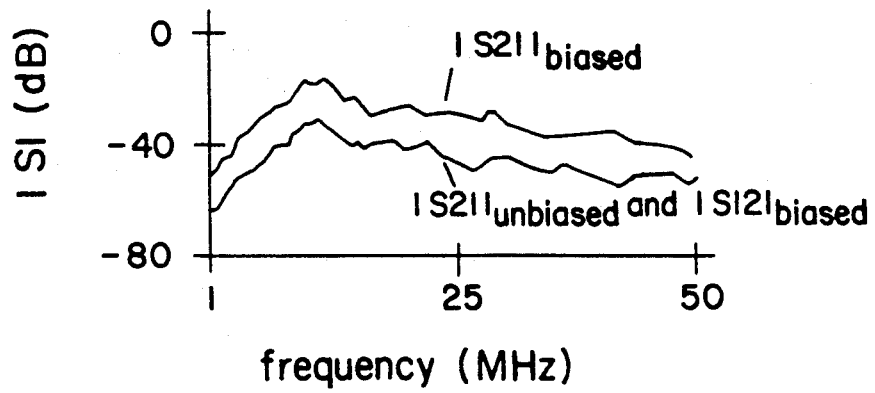
FIG. 6 is a graph showing S parameter data for a YBaCuO device formed in accordance with the present invention.

The experiment compares $S_{21}$ of the device in the biased state with that of the device in the zero bias state and with $S_{12}$ of the device in each bias state. These two quantities indicate the passive and feedthrough properties of the device. In FIGS. 5 and 6 all three of these quantities for both Nb and YBaCuO devices, respectively, are plotted versus frequency. The increase in $S_{21}$ under bias is about 10-15 dB across the band for both devices. In the unbiased state, $S_{21} = S_{12}$ and $S_{12}$ does not change significantly with bias, indicating that the biased performance is active and not the result of anisotropy or a system artifact.

Figure 7:
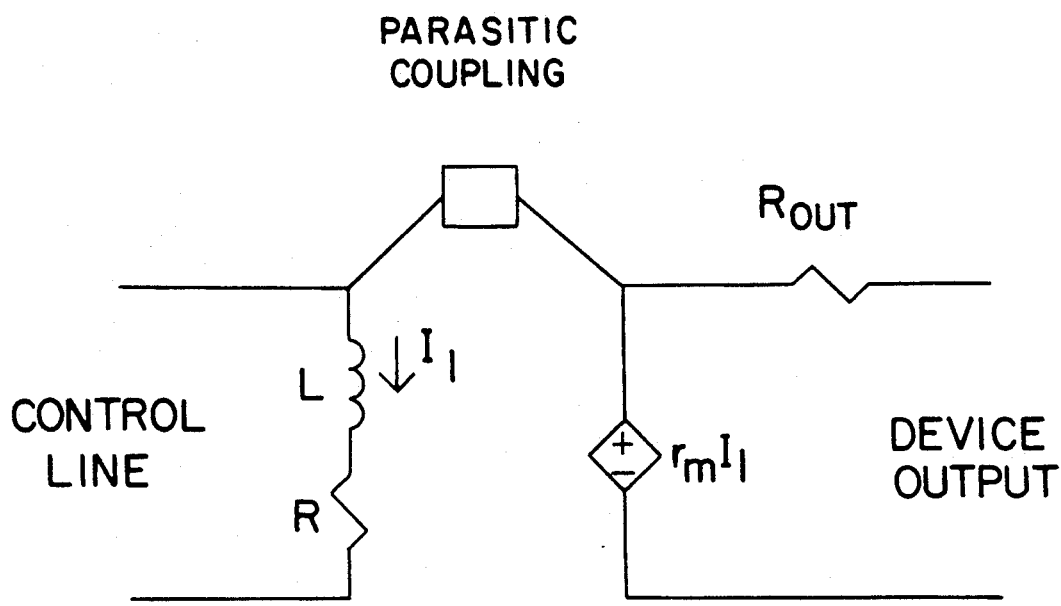
FIG. 7 is a schematic of an equivalent circuit which can be used to estimate $S_{21}$ based on measured low-frequency impedance levels and the measured transresistance.

As a means of verifying the results, the expected power output can be computed from a knowledge of the tranresistance and the impedance levels of the device. The input and output impedances were measured with the HP 8753 network analyzer over the same frequency ranges used in the $S_{21}$ measurements. The input impedance for both types of devices (with transformer connected) looks essentially like a 1 ohm resistor in series with a 2 nH inductor over these frequencies. The output resistance over the same frequencies was measured to be about 2 ohms for Nb devices and about 5 ohms for YBaCuO devices. A simplified equivalent circuit for the Nb device, shown in FIG. 7, which used the measured input and output impedances and the transresistance data from the I-V curve, was constructed. This circuit is a low-frequency equivalent that ignores most parasitics. Calculations on this circuit using the measured transresistances predict an $S_{21}$ of $-34$ dB across the band. This is consistent with the earlier data if one includes coupling and other parasitics inherent to the device. A similar equivalent circuit for a YBaCuO device using measured parameters was also constructed. Calculations on this circuit predict an $S_{21}$ of $-30$ dB across the band. Again, this is consistent with measured data, as discussed above, although the model is considerably simplified. The differences between measured and calculated values for Nb and YBaCuO devices are not the same because the fixture for the YBaCuO device had a more controlled impedance level than did the fixture for the Nb device.

Figure 8:
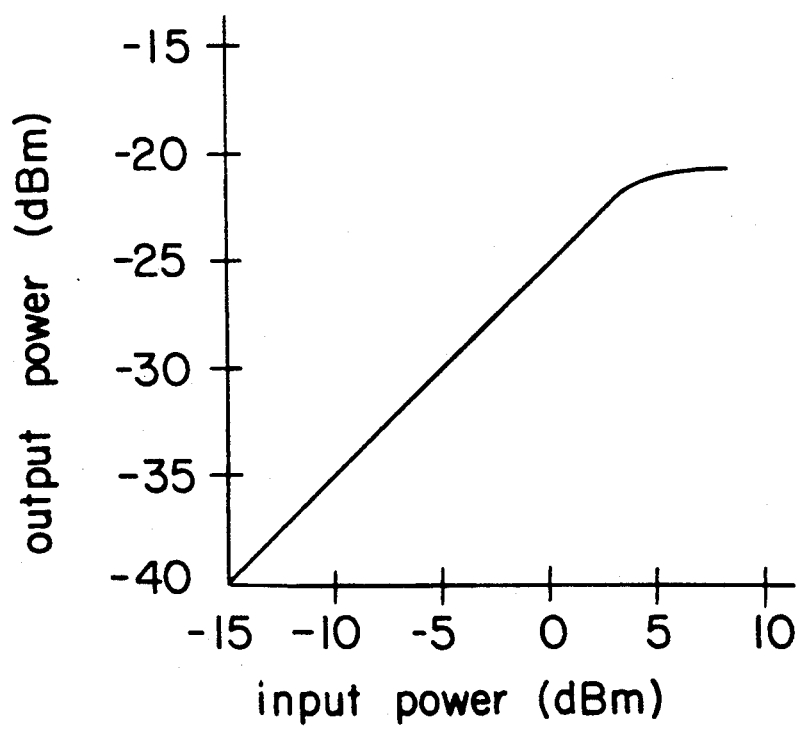
FIG. 8 is a graph of a power transfer curve for a YBaCuO device formed in accordance with the present invention.

Also of interest is the linearity of the device. A plot of measured power output versus input power at 25 MHz for a YBaCuO device is shown in FIG. 8. The 1-dB compression point for the device plus transformer occurs when the input power is +5 dBm. This curve was essentially independent of frequency over the bandwidth of the transformer. The net loss is mainly the result of remaining impedance mismatch and set-up losses.

Figure 9:
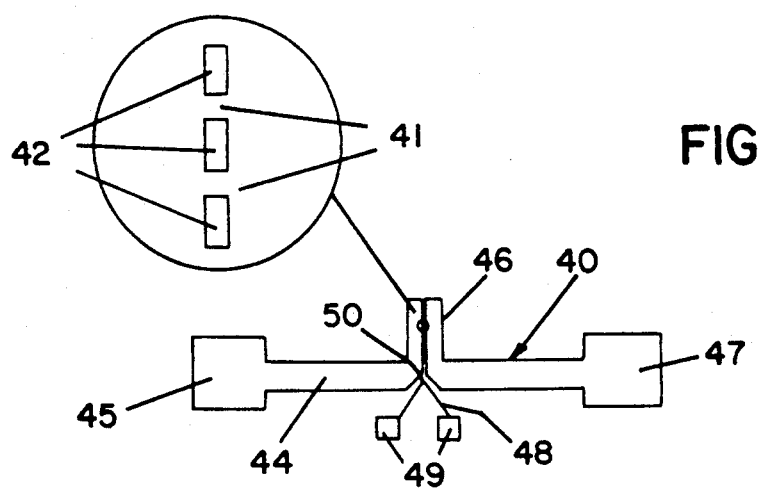
FIG. 9 is an illustrative view of another active device formed of coplanar thin films of superconducting materials on a planar substrate.
Figure 10:
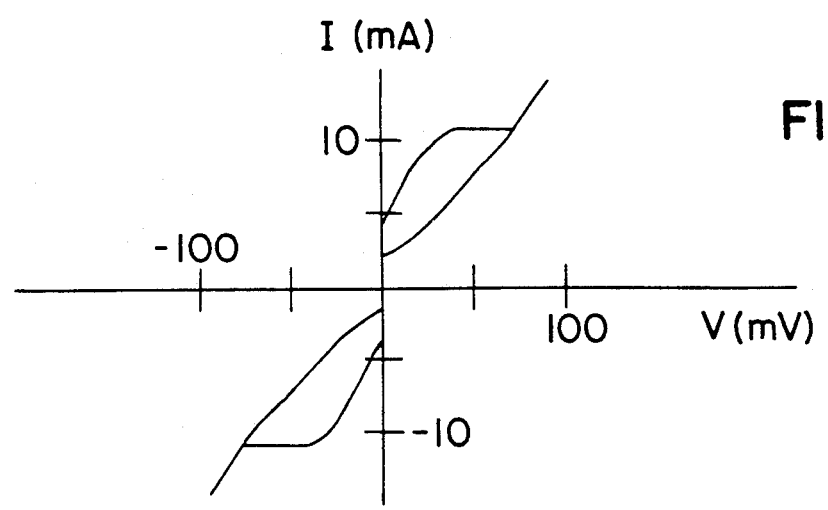
FIG. 10 is an I-V curve for the device of FIG. 9.
Figure 11:
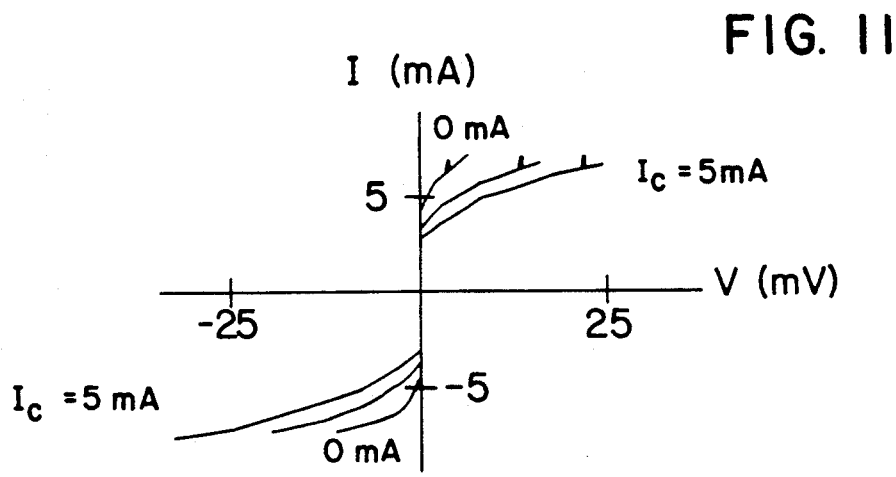
FIG. 11 is an expanded I-V curve for the device of FIG. 9 of FIG. 10 expanded about the zero point and showing the effect of bias current.

Another form of the device is shown generally at 40 in FIG. 9 and consists of 50 links 41 each about 5 microns long by 5 microns wide which are separated by voids or holes 42 in the pattern. The holes are about 5 by 15 microns in size. Each link is greatly reduced in thickness to provide the desired behavior discussed above. The device 40 has a main conducting channel 44 with a bias pad 45, an active weak link region 46, and an output pad 47. A portion of control line 48 extends from contact pads 49 to a peak 50 at a position closely adjacent the active region 46 which contains the weak links 41. The control line is about 20 microns wide and is separated from the active region by about 15 microns at the peak of the control line. The I-V curves are hysteretic and have significant non-linearities at sufficiently high drives. An example I-V curve is shown in FIG. 10. As shown in FIG. 11, a control current, either injected into the device or running through an adjacent control line, changes the I-V curve. This has been attributed to a change in flux density in the device while it is biased in a flux flow region. The flux flow region shown on the I-V curve is the region of biasing for most applications, including oscillators. It is in this region that the control line has its most significant effect. The control signal effect can be modeled by a current controlled voltage source since a current in the control line causes a horizontal shift of the flux flow section of the I-V curve for small control currents. Biasing is done with a current source which is readily realizable because of the very low device impedances. The input and output impedances of the controlled device are very low: input on the order of milliohms, output on the order of ohms. Impedance matching then becomes an important task and output power levels will typically be low. Some impedance levels can be exploited; in particular, the low input impedance is used to advantage in the oscillator design discussed below.

The devices are made of the various conventional superconductors, such as Nb, or one of the high $T_c$ materials, for example, YBaCuO, BiSrCaCuO, or TlCaBaCuO compounds. The Nb films are about 40 nm thick and the links are preferably thinned to about 5-10 nm for the operation described above. The patterning and thinning of the Nb devices can be done with anodic oxidation. Among the high $T_c$ materials mentioned, the Tl compound is most desirable since even after processing, its $T_c$ is still high enough to allow operation at 77K. The films in this case are about 200 nm thick and the links are thinned to about 20-60 nm. Patterning and thinning for the high $T_c$ materials are done with a timed immersion in an $HNO_3$ solution.

Figure 12:
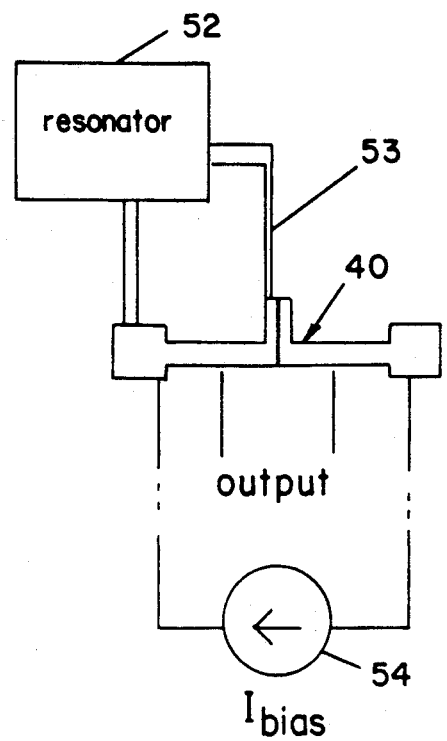
FIG. 12 is a schematic circuit diagram showing an oscillator which may be formed utilizing the device of the present invention.
Figure 13:
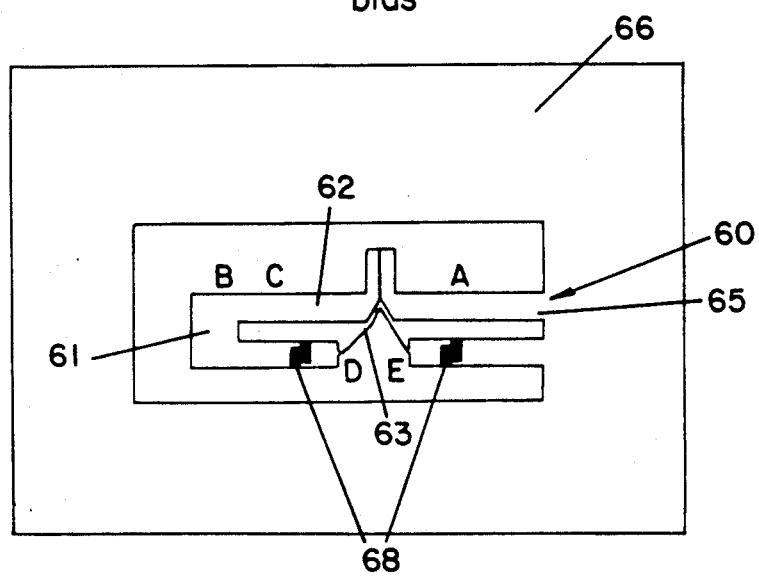
FIG. 13 is a schematic circuit diagram of another version of an oscillator which may utilize the present invention.

Examples of two different circuit topologies for oscillators employing the devices of the present invention are shown in FIGS. 12 and 13. The oscillator of FIG. 12 uses a resonant feedback circuit 52 between the injection line 53 and the device body. This structure has the advantage of ease of design and the possibility of using any of a number of high-Q superconducting resonators. Bias is provided by a current source 54. It does, however, use a large amount of chip area and the tuning of the oscillator could be cumbersome.

Figure 14:
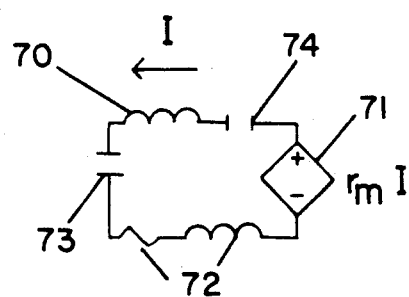
FIG. 14 is a schematic circuit diagram of an equivalent circuit for the device of FIG. 13.

An alternative structure is shown at 60 in FIG. 13 and its equivalent circuit is shown in FIG. 14. The basic circuit for this oscillator, using a generic current-controlled voltage source, is discussed in Clarke and Hess, *Communications Circuits: Analysis and Design,* Reading, Ma. Addison-Wesley, 1978, p. 268. No separate resonator is used in this circuit; it is, instead, built into the topology. The device 60 is similar to the device 40 with one end 61 of the main channel 62 connected to a control line 63. The other end 65 of the main channel and the other end of the control line are connected to a common ground 66. Bias current is driven between points A and B, output is taken from points A and C, and the oscillation frequency can be tuned by driving a low frequency (or DC) current between points D and E. To fit this device, the equivalent circuit uses a current-controlled voltage source 71 and a series resonant circuit. The upper inductor 70 in FIG. 14 represents the control line and hence the current through it is the appropriate controlling quantity. The total inductance is composed of the control line inductance (it is narrow and relatively long) and the internal inductance 72 of the device body. Neither component can be ignored in analyzing the circuit. The largest component of the resistance is the link array: when biased into flux flow, the links do have a finite resistance. The capacitance 73 is essentially provided by a pair of interdigital capacitors 68 which also serve as DC blocks. The control line section is DC isolated for tuning purposes as discussed below. Another purpose of the interdigital capacitors is to dwarf the effect of a parasitic capacitance 74 between the control line and the device body. Since this is a single film, making the interdigital capacitances dominant, it is easier to design a circuit with a given oscillation frequency.

This second structure is compact and has greater possibility for tuning. By applying a DC signal to the isolated control line 63 of FIG. 13, the effective inductance of the device body can be changed significantly (because the bias state of the device has changed) and hence the oscillation frequency will change. The bias point can be changed on either structure to tune the oscillation frequency but the range is not broad.

Figure 15:
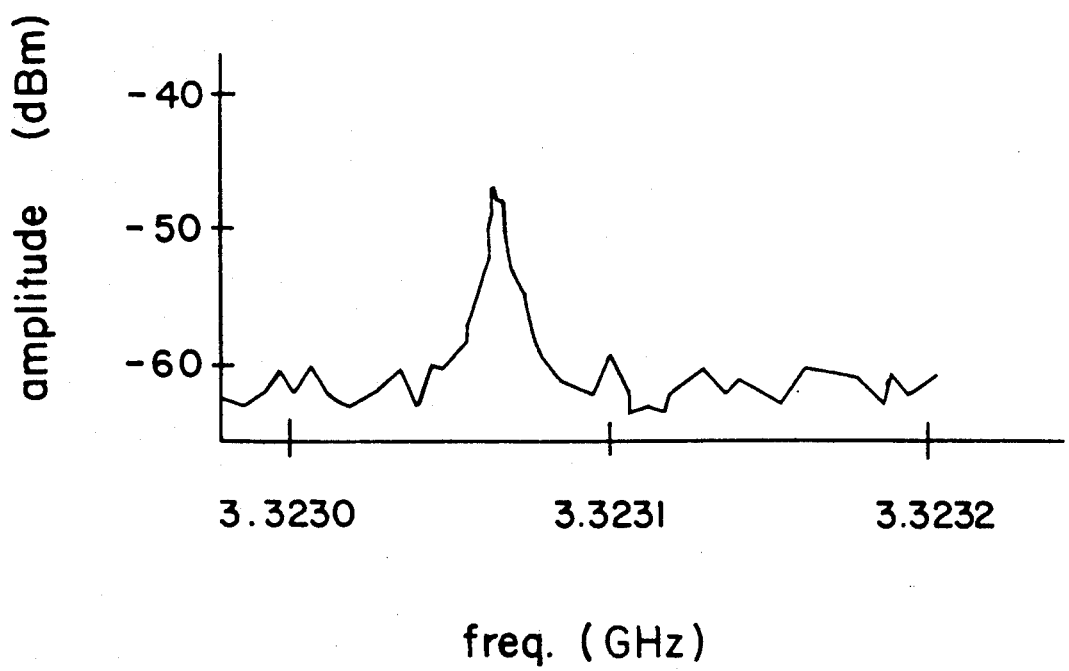
FIG. 15 is a measured output spectra of a circuit formed in accordance to the present invention made of TlCaBaCuO which was tested at 77K for the oscillator configuration of FIG. 12.
Figure 16:
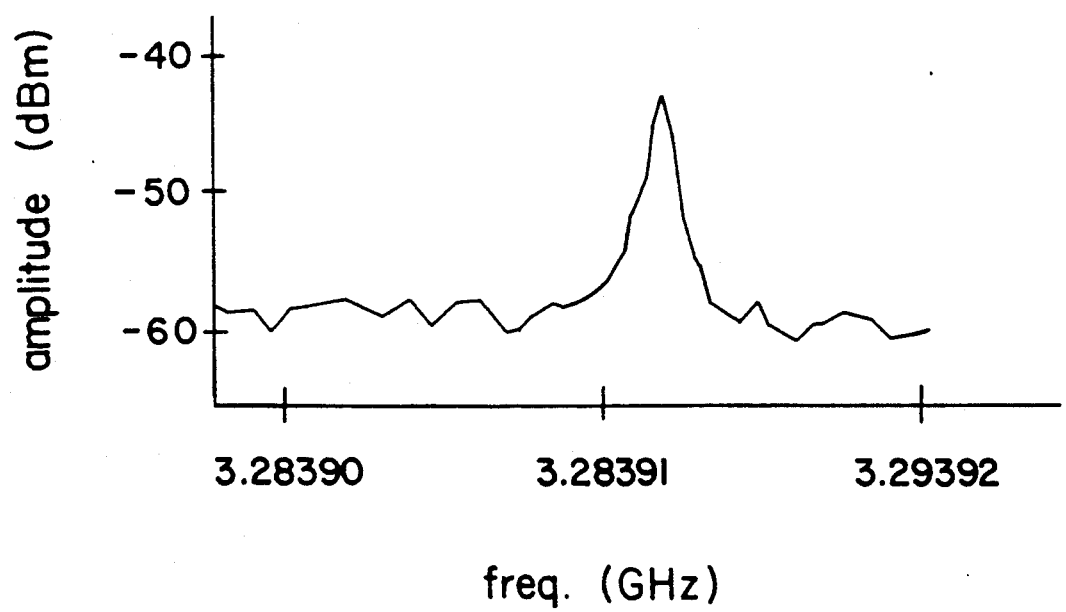
FIG. 16 is the measured output spectra of a device in accordance with the invention made of TlCaBaCuO, tested at 77K, for the circuit configuration of FIG. 13.

Both of the above circuits were built with both Nb and TlCaBaCuO and tested at 4.2K and 77K, respectively. Several versions were built that operated at lower frequencies (700 MHz-2.5 GHz) but shown in FIGS. 15 and 16 are measured spectra for devices oscillating near 3.3 GHz. The spectra shown in FIGS. 15 and 16 are for devices made of TlCaBaCuO tested at 77K. The linewidth of the control line based oscillator (FIG. 13) was smaller than that for the injection line based circuit (FIG. 12) but this is largely because a relatively low-Q coplanar strip resonator was used for the latter circuit. The output power in both cases was near −40 dBm and this could be increased by probably 10 dB if the output were better matched.

Figure 17:
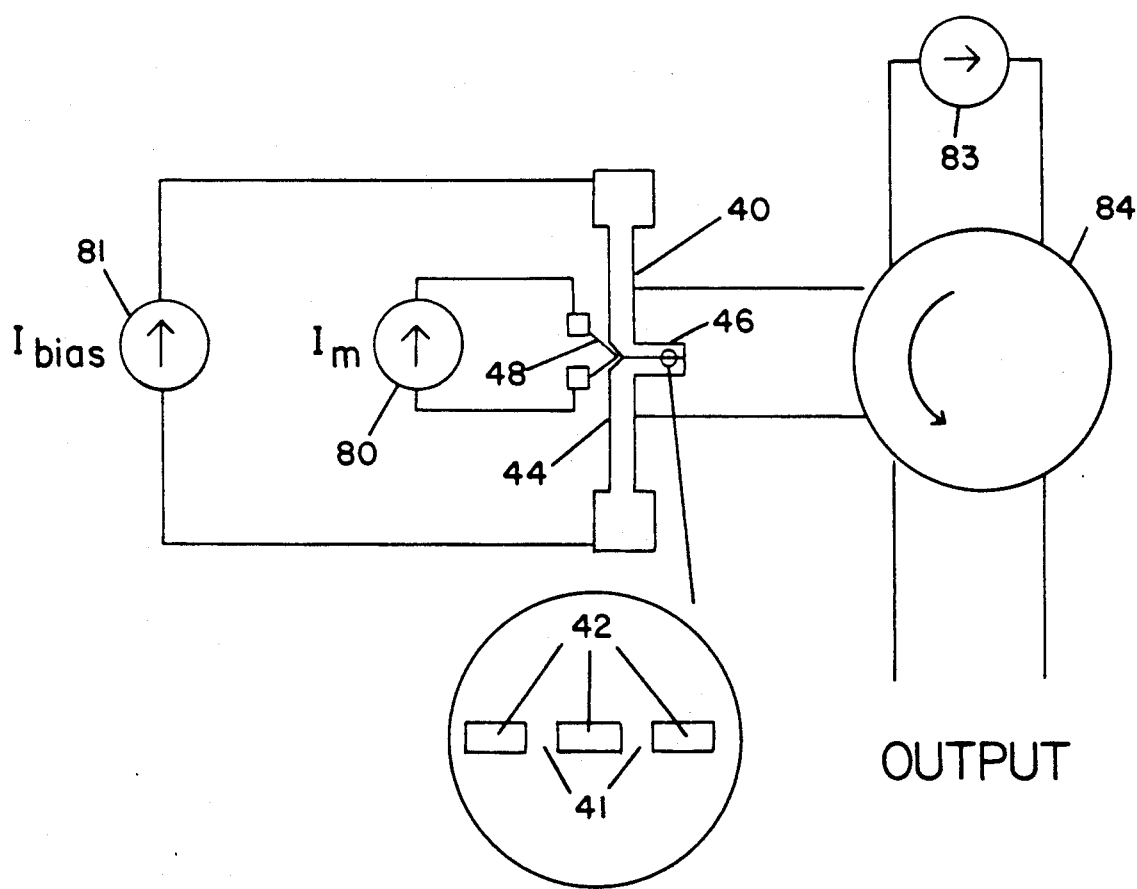
FIG. 17 is a schematic circuit diagram for a phase modulator in accordance with the present invention.

When both circuits were tuned with the bias current, the maximum deviation was limited to about 5% of center frequency. When the added DC control current (mentioned above) was used to tune the control line based circuit, a maximum deviation of 20% was achieved. Hence, this second topology has a definite advantage in terms of size and tunability. There is yet another structure, with more complicated fabrication, that can achieve greater tunability. A heater line can be placed over the control line, allowing the penetration depth and hence the inductance in the model to be changed over a very wide range. With such a structure, the range could theoretically be increased to well over an octave. A phase modulator capable of being made with high or low $T_c$ materials is shown in FIG. 17 and is also based on an array of weak links biased into a flux flow regime. The weak link structure used is the device 40 of FIG. 9. In the flux flow state, magnetic flux is admitted to the link region 46 and travels in a direction perpendicular to the bridge length, that is, along the row of links 41. The density of this flux is controlled by the external control line 48 that generates a magnetic field as current is passed through it.

Exemplary devices were made from films of TlCaBaCuO deposited to a thickness of, typically, 300 nm, as discussed above. The films were predominantly $Tl_2Ca_2Ba_2Cu_3O_{10}$ with some syntactically grown $Tl_2CaBa_2Cu_2O_7$. The films are c-axis oriented and consist of large platelets with less than 10% voids. Patterning is done with conventional lithography and a timed etch of dilute $HNO_3$. The links are about 7 microns in length and typically 1 micron wide. After the links are formed, the entire link region is thinned in another acid etch to about 50-100 nm. This stage is critical and determines the sensitivity of the device with respect to the control current and determines the behavior of the controllable inductance of the device.

The basic circuit for the modulator is shown in FIG. 17. A modulating signal applied to the control line 48 from a source 80 alters the impedance in the device body. Bias current is applied to the device main channel 44 from a source 81. The dominant change in impedance seen at the main channel terminals (in the region of operation) is a change in inductance. An RF signal applied to the main channel from a source 83 through a circulator 84 then essentially sees a reactive impedance whose magnitude varies with the modulating signal. The phase of the circulator-coupled reflected wave from the device body then varies directly (and linearly) with the modulating signal. The reflection coefficient Γ (reflected wave amplitude/incident wave amplitude) is given by $$\Gamma = (jX_L - R_0)/(jX_L + R_0) + \exp[-2j\tan^{-1}(2\pi f_c L/R_0)]$$

where
$R_O$ = transmission line impedance
L = device body inductance
$f_c$ = carrier frequency
$X_L$ = total output inductive reactance This relation holds because the output inductance dominated the output impedance of the device.

If the device inductance varies linearly with control current then the phase of the reflected wave will as well, assuming that the inductive impedance is small relative to the line impedance $R_O$. This is certainly true for this circuit for frequencies through X-band. Hence, $$\Gamma \approx \exp[-j4\pi f_c K\, I_m/R_O]$$

where
K = inductance-control current ratio.
$I_m$ = control line (modulating) current $I_m$ controls $L_{out}$ of the equivalent circuit of FIG. 18. The other component of the inductance, $L_{fix}$, just adds a constant phase term and can be omitted. This basic principle as used in this modulator is well known in the art.

Figure 18:
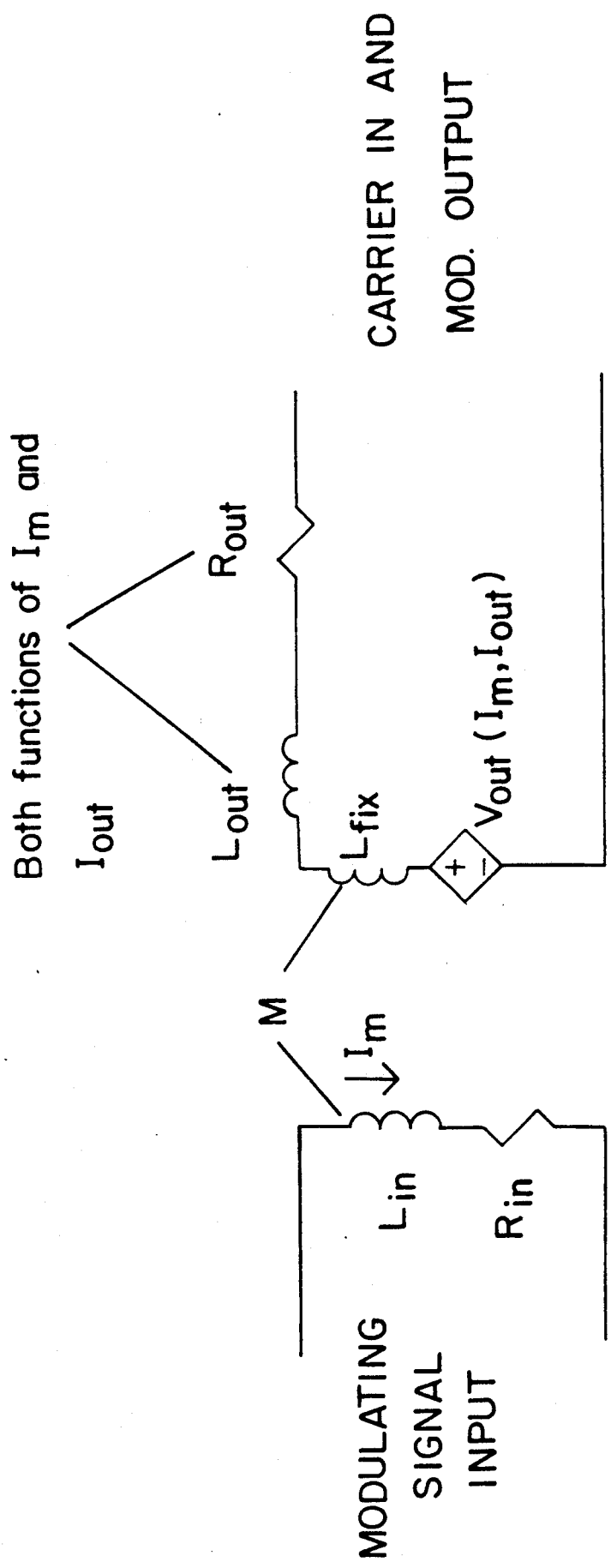
FIG. 18 is a schematic circuit diagram of an equivalent circuit for the modulator of FIG. 17.

In the equivalent circuit of FIG. 18, all component values on the output side are dependent on both $I_m$ and $I_{out}$. These two variables are actually coupled (in a complicated way) through the controlled voltage source and the impedance of the output circuit. These dependencies can be approximated by a product of polynomials, one a function of $I_m$ and the other a function of $I_{out}$. Since $V_{out}$ is not large (on the order of 10 mV in the region of operation), if the load is greater than about 10-20 ohms, $I_{out}$ is quite linear with respect to $I_m$ as determined by non-linear modeling. The correlation coefficient, a measure of the linearity between the current and the inductance in question with 1 representing a completely linear relation and 0 representing no linear relation, exceeds 0.9 for these variables. When the operation frequency is sufficiently high (>300 MHz) the inductive reactance is the dominant term in the body impedance. The resistive and voltage dependencies are comparably weak so the device appears to be well-suited for phase modulation.

A triangle wave was used as a modulating signal to this circuit and the output spectrum was compared to that of a commercial FM modulator with a square wave input. The square wave amplitude had to be adjusted to match parameters such as modulation sensitivity but the FM spectrum of a square wave should match the PM spectrum of a triangle wave. The spectra were essentially identical when the modulation amplitudes were adjusted as described above.

Figure 19:
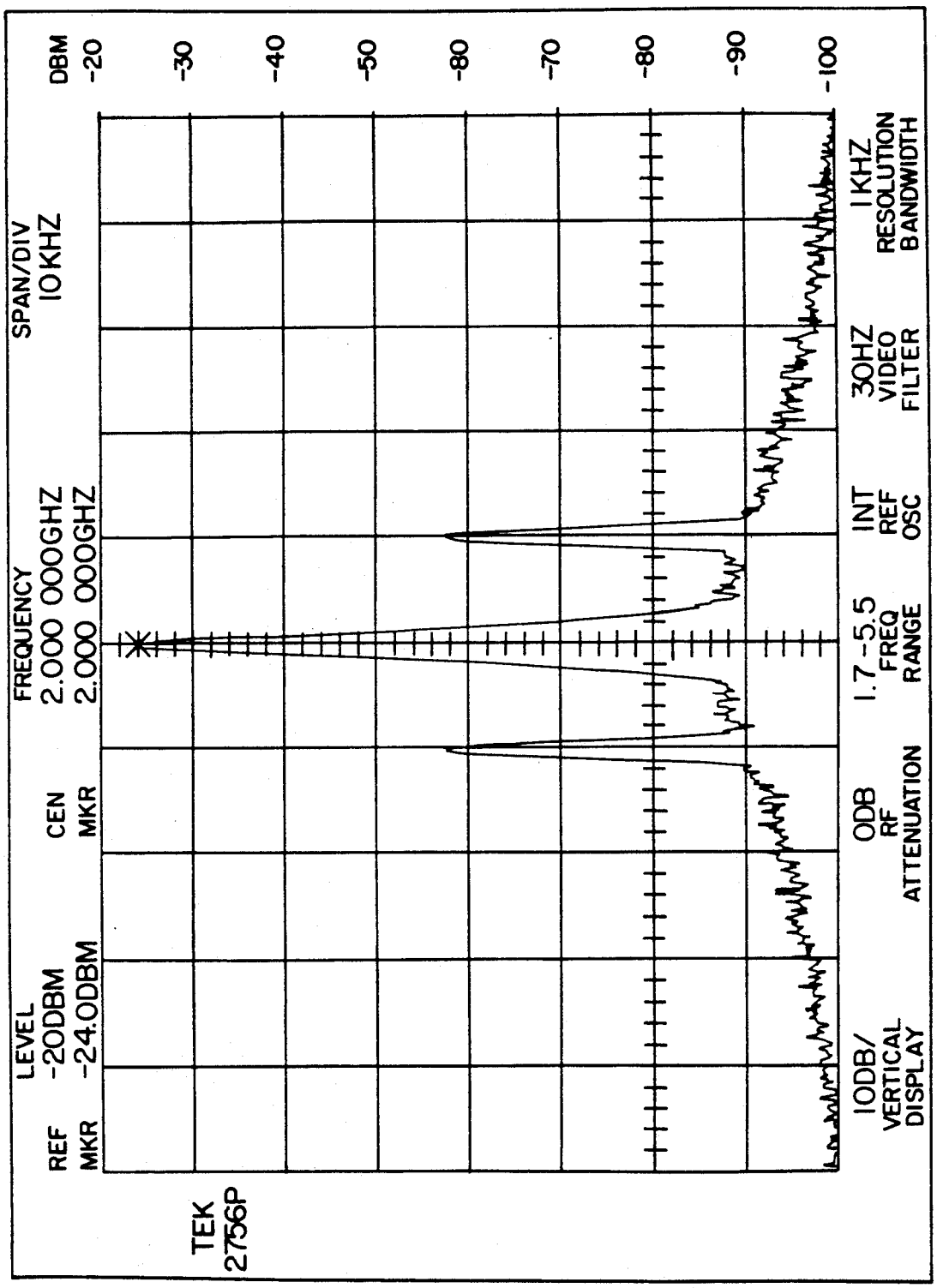
FIG. 19 and 20 are plots of measured modulation depths for the device of FIG. 17.
Figure 20:
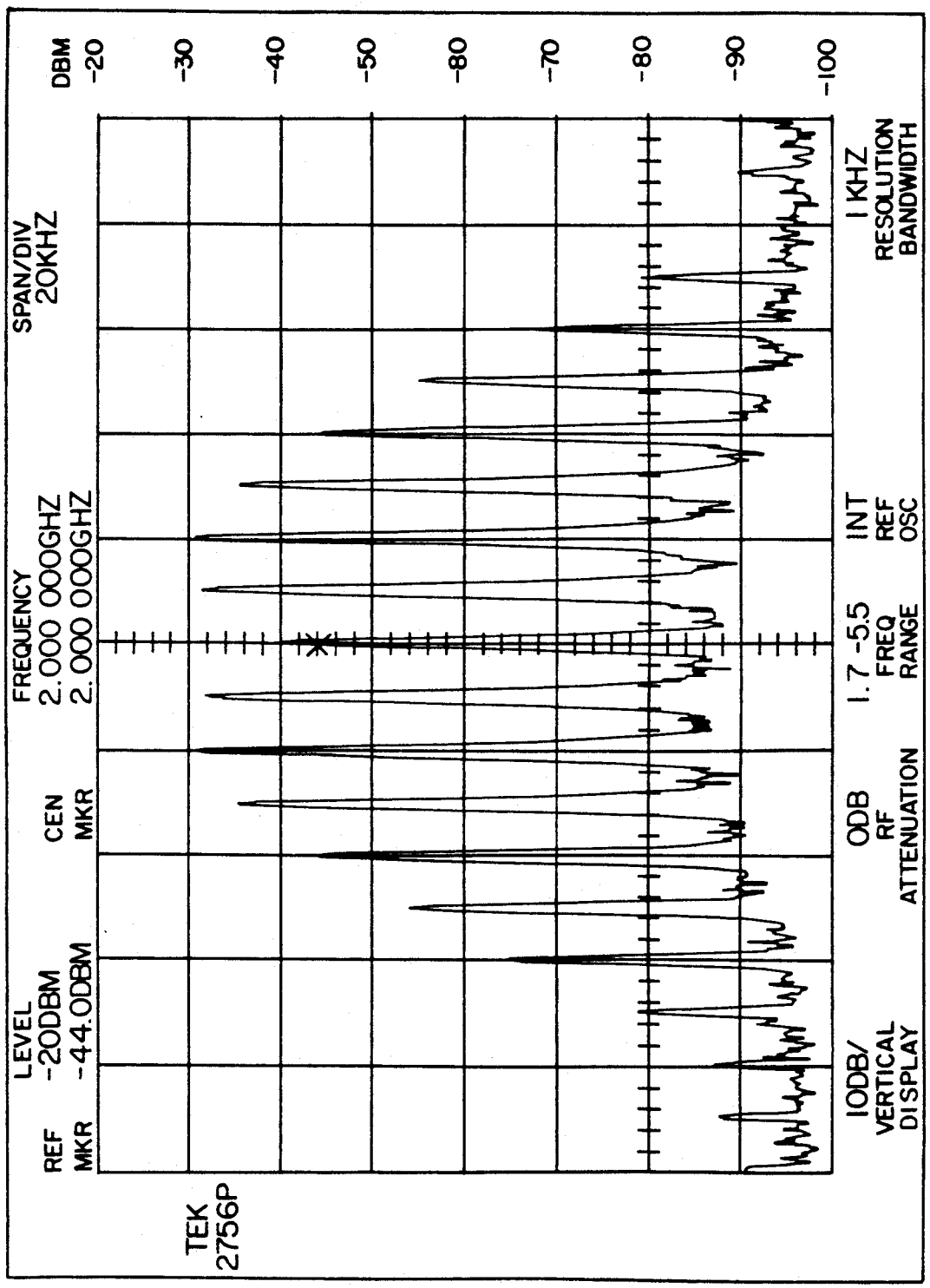

A wide range of modulation depths was possible. Peak phase deviations (equivalent to an FM modulation index) up to 500 radians have been observed. The peak phase deviation is defined as the maximum deviation from carrier phase using a unit amplitude modulating signal. The plots in FIGS. 19 and 20 illustrate the range of modulation depths available with low distortion. There is a point, however, when the non-linearities of the device become important. This limit is dependent on modulating frequency and carrier frequency. For $f_c=2.0$ GHz and $f_m=10$ KHz, the maximum peak phase deviation before noticeable distortion is about 100 radians.

Figure 21:
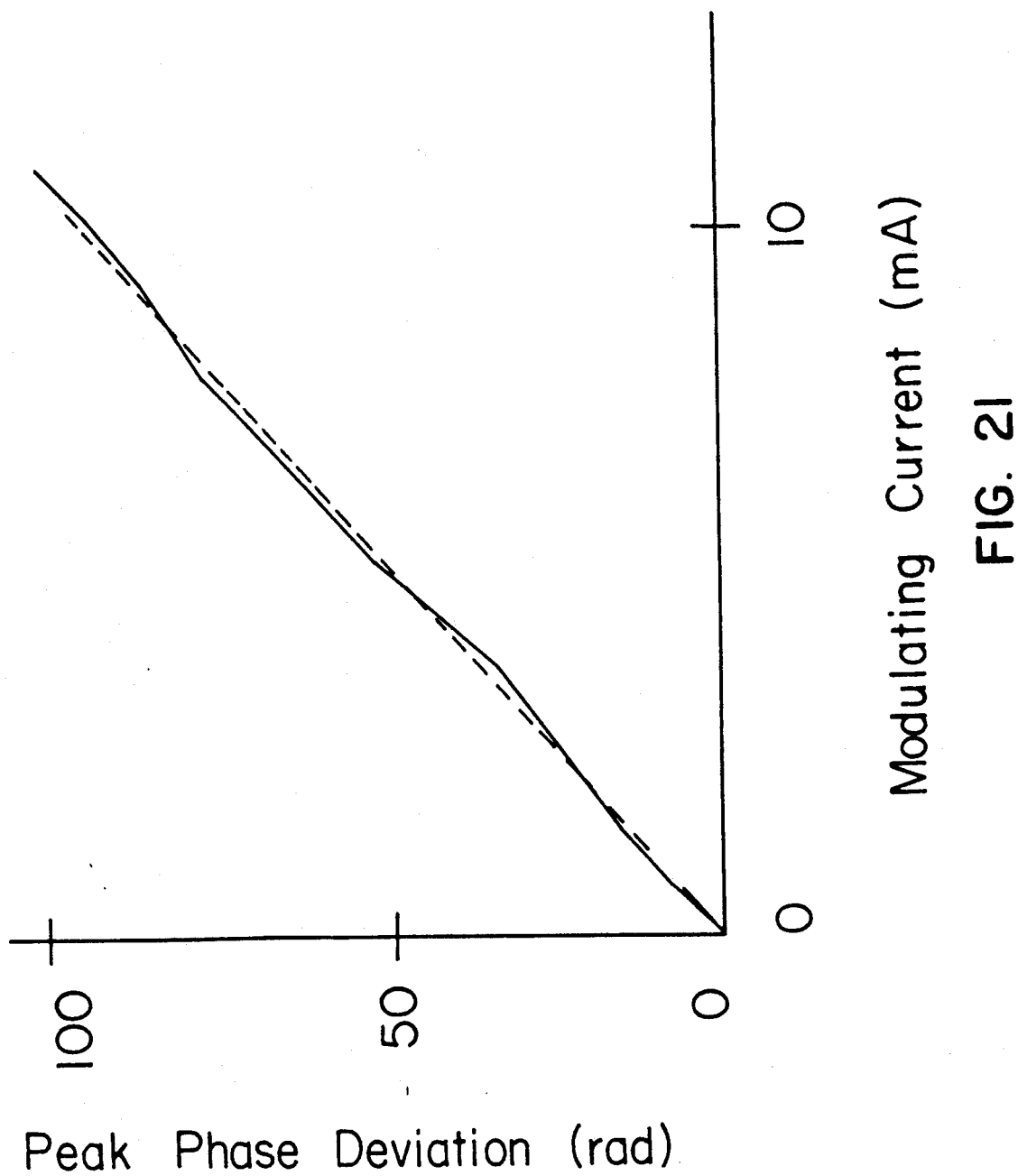
FIG. 21 is a plot of peak phase deviation versus modulating current for the device of FIG. 17.

A plot of phase deviation versus modulating current can be generated and is shown in FIG. 21 for $f_m=10$ kHz and $f_c=2.0$ GHz. The linearity of the curve changed little for $f_m/f_c$ between $10^{-6}$ and 0.01 and $f_c$ ranging from 300 MHz to about 6 GHz. The upper carrier frequency limit is due to the test fixture. The transfer function is clearly quite linear over a wide range of modulation depths as seen from this plot. The transfer coefficient is about 9.1 rad/mA.

Figure 22:
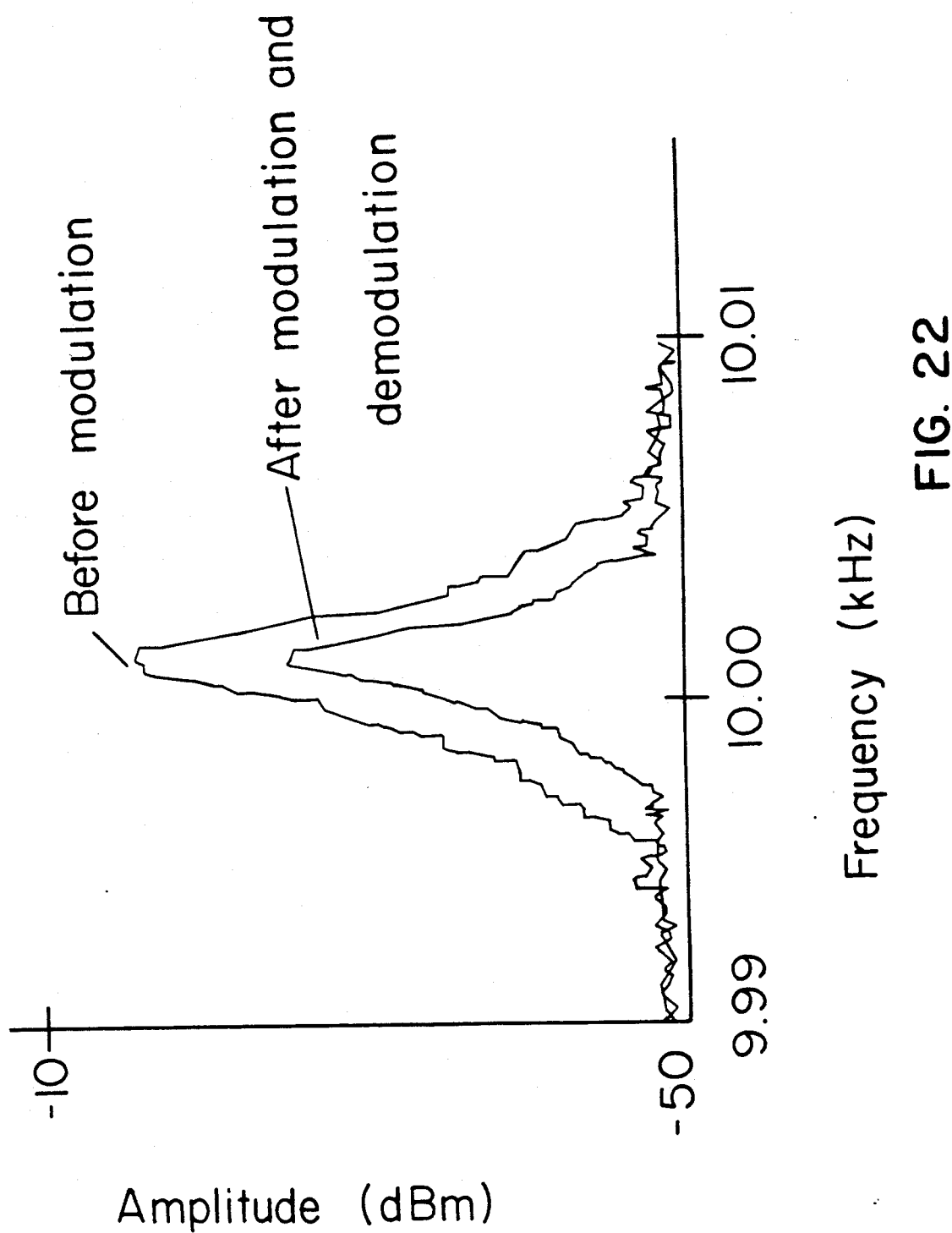
FIG. 22 are plots of spectra obtained from the device FIG. 17 allowing the level of distortion of the device FIG. 17 to be determined.

Another specification of importance is distortion. To analyze this, a known signal was fed into the modulator and its spectrum recorded. This modulated wave was sent to a commercial FM demodulator and this output spectrum was compared to that of the original modulating signal. The modulating signal was a sine wave. The constant for FM would be that for PM divided by the angular modulation frequency assuming equal modulation sensitivities. Aside from an amplitude factor (attenuation and difference between the modulating and demodulating constants), the spectra are essentially the same, as shown in FIG. 22. This level of distortion was typical as long as the frequency limits above were observed and the peak phase deviation was kept below about 100 radians. It is important that the carrier frequency be in the correct range (discussed above) so the assumptions made about the size of the inductive reactance remain valid.

For carrier frequencies from 300 MHz to 6 GHz with modulation frequencies running from $10^{-6} f_c$ to 0.03 $f_C$, the behavior discussed above essentially holds. Modulation has been observed for frequencies in excess of 35 GHz using a waveguide setup. The device body is placed in a longitudinal slit in the waveguide (for RF interaction) and its terminals are exposed for connection to the low frequency part of the test system. Modulation frequencies from 1 KHz to 5 GHz were tried (applied to the control line via its exposed terminals) and modulation was detected at the output of the waveguide system using a standard diode detector. The modulation information was extracted by using the detector to mix the modulated signal and an addition sample of the 35 GHz carrier. The output of the detector was then the low frequency modulating signal and this modulating signal was returned for the modulating frequencies in the range listed above.

This circuit shows very broadband, linear and low distortion phase modulation from a single chip modulator. Modulation has been observed for RF frequencies over 35 GHz and the circuit has modulated linearly and with very low distortion for peak phase deviations up to 100 radians. The device Operates at 77K when made of TlCaBaCuO, introduces little nOise for that reason, and is relatively easy to fabricate. Another application of considerable interest is a linear phase shifter. This is exactly the principle of operation of this modulator.

When all of the signal current is driven through the device body, the inductance depends non-linearly on current for reasonable drive levels. Hence, another application is as a parametric amplifier.

It is understood that the invention is not confined to the particular embodiments set forth herein as illustrative, but embraces all such forms thereof as come within the scope of the following claims.

What is claimed is:

1. A controllable active superconducting device comprising:
   (a) a main conduction channel formed of a film of superconductor on a substrate;
   (b) an active weak link region interposed sin the main conduction channel, the active weak link region composed of a plurality of links formed of a thin film of superconductor separated by non-superconductive voids, the thickness and lateral dimensions of the links selected such that magnetic flux can propagate across the weak link region when it is superconducting;
   (c) means for providing a magnetic flux to the active weak link region which can propagate across the weak link region to control the resistance of the weak region.

2. The device of claim 1 wherein the means for providing a magnetic flux comprises a control line formed of a film of superconductor on the substrate coplanar with the main conduction channel and having a portion adjacent to the active weak link region such that current in the control line will impose a magnetic flux on the weak link region.

3. The device of claim 1 wherein the main conduction channel and the weak link region are formed of a superconductor having a superconducting transition temperature above the temperature of liquid helium or liquid hydrogen.

4. The device of claim 3 wherein the superconductor is selected from the group consisting of superconducting compounds of YBaCuO, BiSrCaCuO, and TlCaBaCuO.

5. The device of claim 1 wherein the superconductor forming the main conduction channel and the active weak link region is a metallic superconductor.

6. The device of claim 5 wherein the superconductor is niobium.

7. The device of claim 1 wherein the weak link region is formed of a thin film of superconductor with a series of spaced holes formed in the film in a row, the portions of the superconductor between the holes defining the weak links.

8. The device of claim 4 wherein the thickness of the superconducting film forming the weak links is about 100 nanometers or less.

9. The device of claim 8 wherein the thickness of the superconducting film forming the weak links is in the range of 20 to 100 nanometers.

10. The device of claim 5 wherein the thickness of the superconducting film forming the weak links is about 10 nanometers or less.

11. The device of claim 5 wherein the thickness of the superconducting film forming the weak links is in the range of about 5 to 10 nanometers.

12. The device of claim 1 wherein each weak link has a size in the range of about 5 to 10 microns wide and 5 to 10 microns long.

13. The device of claim 2 wherein the control line is formed with a portion thereof spaced no more than about 15 microns from one end of the weak link region.

14. The device of claim 1 wherein the weak link region comprises an array of weak links spaced from one another in a row in a straight line with voids between them and wherein the means for providing magnetic flux comprises a conducting control line formed coplanar with the main conduction channel and the weak link superconducting film, the control line having a portion which extends to a position adjacent to one end of the row of links such that magnetic flux initiated from current in the control line will propagate along the row of links.

15. The device of claim 14 wherein the control line is formed of a film of a superconducting material.

16. A superconducting amplifying device comprising;
(a) a main conduction channel formed of a film of superconductor on a substrate;
(b) an active weak link region interposed in the main conduction channel, the active weak link region composed of at least one link formed of a thin film of superconductor bounded by non-superconductive voids, the thickness and lateral dimensions of the links selected such that magnetic flux can propagate across the weak link region when it is superconducting;
(c) a control line having a portion adjacent to the active weak link region such that current in the control line will impose a magnetic flux on the weak link region;
(d) means for applying selected biasing current to the main conduction channel when in the superconducting state such that a change in the current applied to the control line will result in a change in the voltage across the weak link region of the main conduction channel.

17. The device of claim 16 wherein the main conduction channel and the weak link region are formed of a superconductor having a superconducting transition temperature above the temperature of liquid helium or liquid hydrogen.

18. The device of claim 17 wherein the superconductor is selected from a group consisting of superconducting compounds of YBaCuO, BiSrCaCuO, TlCaBaCuO.

19. The device of claim 16 wherein the superconductor forming the main conduction channel and the active weak link region is a metallic superconductor.

20. The device of claim 19 wherein the superconductor is niobium.

21. The device of claim 16 wherein the weak link region is formed of a thin film of superconductor with a series of spaced holes formed in the film in a row, the portions of the superconductor between the holes defining the weak links.

22. The device of claim 18 wherein the thickness of the superconducting film forming the weak links is about 100 nanometers or less.

23. The device of claim 18 wherein the thickness of the superconducting film forming the weak links is in the range of 20 to 100 nanometers.

24. The device of claim 19 wherein the thickness of the superconducting film forming the weak links is about 10 nanometers or less.

25. The device of claim 19 wherein the thickness of the superconducting film forming the weak links is in the range of about 5 to 10 nanometers.

26. The device of claim 16 wherein each weak link has a size in the range of about 5 to 10 microns wide and 5 to 10 microns long.

27. The device of claim 16 wherein the control line is formed with a portion thereof no more than about 15 microns from one end of the weak link region.

28. The device of claim 16 wherein the weak link region comprises an array of weak links spaced from one another in a row in a straight line with voids between them.

29. The device of claim 16 further including an impedance matching transformer having its secondary connected to the ends of the control line and having its primary available to be driven by an input signal.

30. The device of claim 16 further including means for feeding the output signal from the main conduction channel back to the control line to cause the output voltage across the weak link region of the main conduction channel to oscillate at a selected frequency.

31. The device of claim 16 further including means for applying a high carrier frequency signal to the main conduction channel across the active weak link region and further comprising means for applying a lower modulating frequency signal to the control line such that the output of the main conduction channel across the active weak link region is the carrier frequency signal phase modulated by the lower frequency signal applied to the control line.

32. A method of controlling the electrical quantities in superconducting circuits comprising the steps of:
(a) conducting current through a superconducting path including a main conduction channel formed of a film of superconductor on a substrate and an active weak link region interposed in the main conduction channel, with the active weak link region composed of a plurality of links formed of a thin film of superconductor separated by non-superconducting voids with the thickness and lateral dimensions of the links selected such that magnetic flux can propagate across the weak link region when it is superconducting;
(b) applying magnetic flux to the weak link region and propagating magnetic flux vortices across the weak links in the weak link region to control the resistance of the weak link region to the current flowing therethrough.

33. The method of claim 21 wherein the step of applying magnetic flux to the weak link region is carried out by running current through a control line positioned adjacent to the weak link region such that the magnetic field from the current flowing in the control line will reach the weak link region and provide flux which will propagate across the weak link region.

* * * * *

UNITED STATES PATENT AND TRADEMARK OFFICE
CERTIFICATE OF CORRECTION

PATENT NO. : 5,019,721

DATED : May 28, 1991

INVENTOR(S) : Jon S. Martens, et. al.

It is certified that error appears in the above-identified patent and that said Letters Patent is hereby corrected as shown below:

Column 9, line 62 "Operates" should be --operates--.

Column 9, line 63 "nOise" should be --noise--.

Column 10, line 12 "Sin" should be --in--.

Column 10, line 23 insert --link-- after "weak".

Column 11, line 14 "comprising;" should be --comprising:--.

Column 12, line 53 "21" should be --32--.

Signed and Sealed this

Twenty-second Day of December, 1992

Attest:

DOUGLAS B. COMER

Attesting Officer

Acting Commissioner of Patents and Trademarks

UNITED STATES PATENT AND TRADEMARK OFFICE
CERTIFICATE OF CORRECTION

PATENT NO. : 5,019,721

DATED : May 28, 1991

INVENTOR(S) : Jon S. Martens, et al.

It is certified that error appears in the above-identified patent and that said Letters Patent is hereby corrected as shown below:

Insert in column 1, at line 3, after the title and before the "FIELD OF THE INVENTION":

-- This invention was made with United States Government support. The support was a grant from the Air Force Office of Scientific Research, AFOSR Grant No. 89-0052, and from the Department of Energy (DOE) via a subcontract under funds awarded by the Department of Energy to Sandia National Laboratories, Subcontract number 06-0832. The United States Government has certain rights in this invention. --.

Signed and Sealed this

Thirteenth Day of April, 1993

Attest:

STEPHEN G. KUNIN

Attesting Officer

Acting Commissioner of Patents and Trademarks